United States Patent [19]
Nordstrom et al.

[11] 3,821,615
[45] June 28, 1974

[54] LONG LIFE LEAD FRAME MEANS FOR SEMICONDUCTOR DEVICES

[75] Inventors: Donald B. Nordstrom, Lake Park; Peter Napierkowski, North Palm Beach, both of Fla.

[73] Assignee: Solitron Devices, Inc., Tappan, N.Y.

[22] Filed: May 16, 1973

[21] Appl. No.: 360,734

[52] U.S. Cl. .......................... 317/234 R, 317/234 N
[51] Int. Cl. .......................... H01l 5/02
[58] Field of Search .......................... 317/234

[56] References Cited

UNITED STATES PATENTS

| | | | |
|---|---|---|---|
| 3,569,797 | 3/1971 | Simmons | 317/234 |
| 3,597,666 | 8/1971 | Taskovich | 317/235 |
| 3,736,367 | 5/1973 | Heinlen et al. | 174/52 S |

*Primary Examiner*—Rudolph V. Rolinec
*Assistant Examiner*—E. Wojciechowicz
*Attorney, Agent, or Firm*—Richard G. Geib

[57] ABSTRACT

A lead frame for a semiconductor device having a plurality of skinny leads with larger contact areas adapted to permit assembly of the device to the frame and permit longer life cycles of operation.

3 Claims, 6 Drawing Figures

LONG LIFE LEAD FRAME MEANS FOR SEMICONDUCTOR DEVICES

BACKGROUND OF INVENTION

Early prior art devices in the field of this invention disclosed semiconductor dies attached to substrates by placing a layer of solder on the substrate, heating the substrate to melt the solder and then placing the die on the solder and "scrubbing" the die into the substrate to ensure a good bond between the die, the solder and the substrate. Wires were then attached to selected areas of the die and to connecting pins.

This type of package was then improved by the teaching, as seen in U.S. Pat. No. 3,597,666, providing for a lead frame formed from a strip to have a substrate or base in one plane a plurality of leads in another plane connected to said base by a strip that forms an "S" intermediate said planes with two of the leads bending downwardly around and back to a point of contact with the base. This disclosure permitted the insertion of a semiconductor die by bending back the leads to a position where the die was under the two leads. Upon release of the leads the two leads aforesaid sprung back to hold the die for subsequent heating whereby solder coated on the ends of the two leads and on the base at a selected area bonds the base and leads to selected contact points of the die. Thereafter, a plastic housing was formed over the area of the die and a portion of the leads.

It has been found with respect to such devices that the heat of operation of the semiconductor die, which was intended to be carried away from the package by the base or substrate acting as a heat sink, tended to create thermal expansion in the plastic which acted upon the leads so as to cause cycling of forces upon the bonds of the leads to the die. This has produced a life cycle for such devices that is considerably less than that desired by the industry.

OBJECTS OF INVENTION

It is therefore the object of this invention to provide a lead frame for a semiconductor die that not only eliminates die and wire bonding operations as tedious and expensive as the early prior art, but improves upon the advancement in this technology by eliminating therefrom the effects of differing thermal expansion characteristics of lead frame and housing materials.

A more particular object of this invention is to form a lead frame from one strip of metal such that the leads within the housing are of filament size while retaining large bond area with the die such that the expansion of a housing in all directions is absorbed by the leads before reaching the contact points on the die.

Stated another way it is the object of this invention to cushion the bond contact of leads to a semiconductor device such that cycling thermal loads do not destroy same.

DRAWING DESCRIPTION

DETAILED DESCRIPTION

Figures 1, 2:
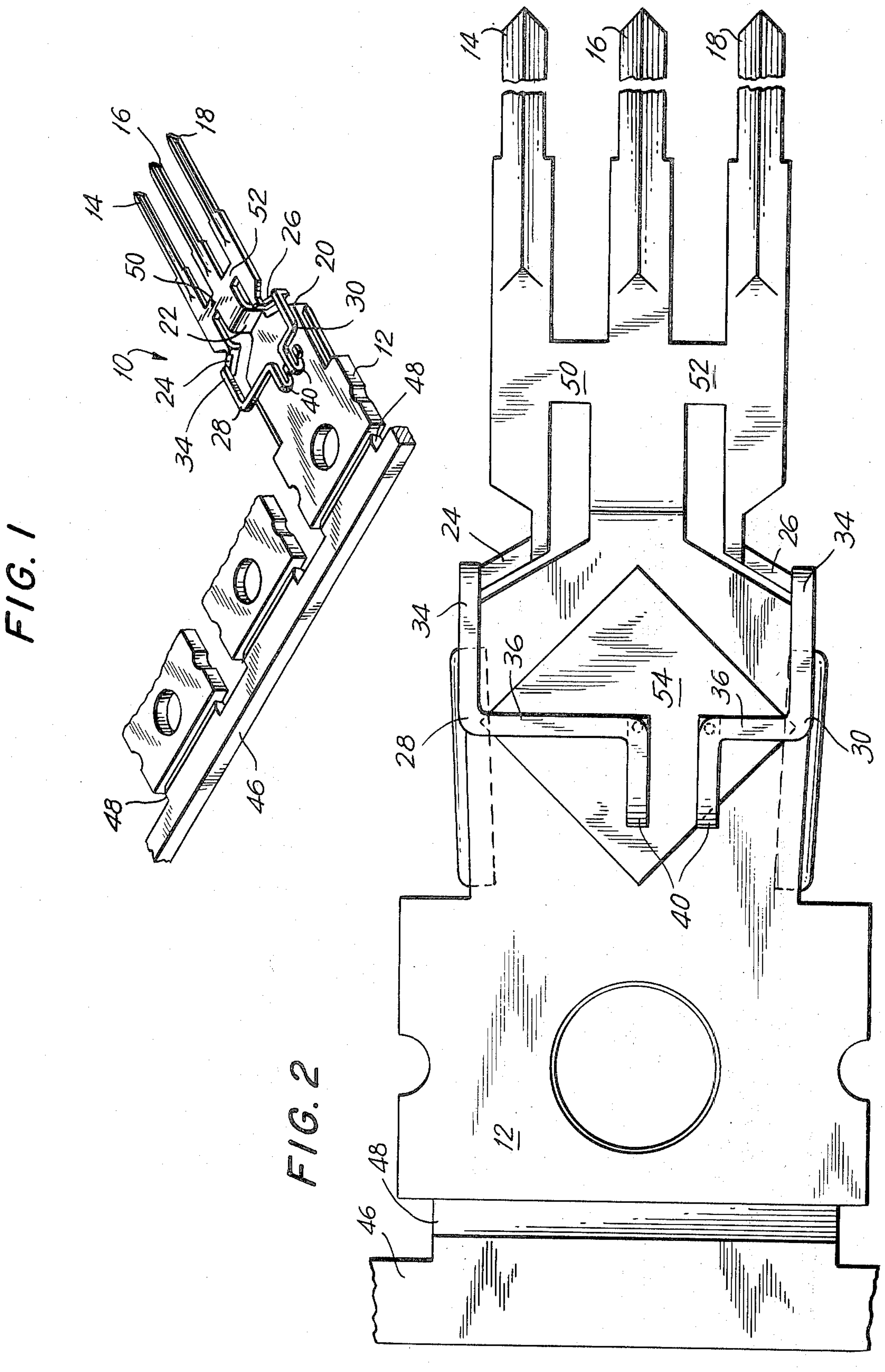
FIG. 1 is a perspective view of a plurality of lead frames constructed in accordance with this invention.
FIG. 2 is a broken plan view of a single lead frame constructed in accordance with this invention with a semiconductor die thereon.
Figure 3:
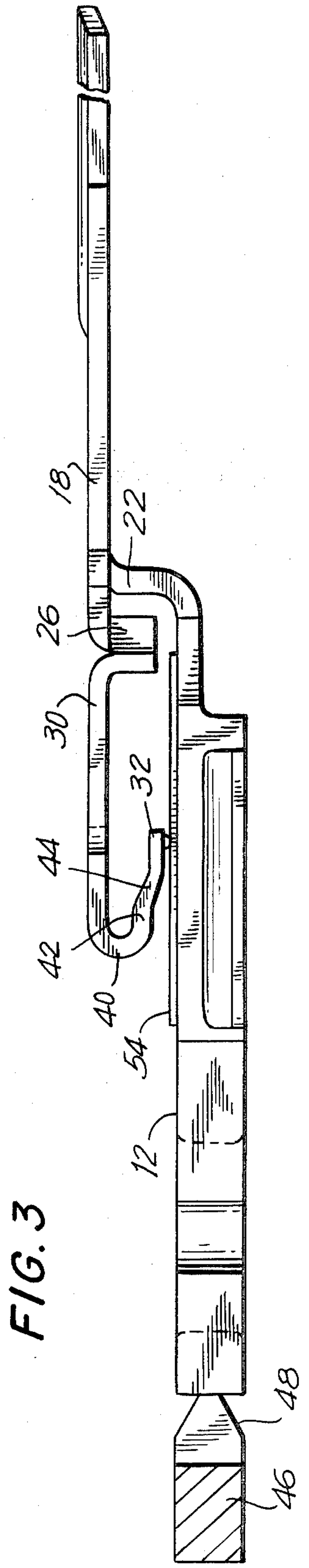
FIG. 3 is a broken side view of a single lead frame constructed in accordance with this invention with the semiconductor die thereon.
Figure 6:
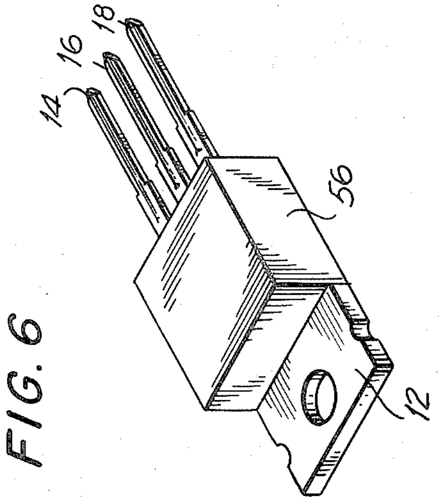
FIG. 6 is a perspective view of the lead frame having a plastic housing thereover forming an operative semiconductor device.
Figure 4:
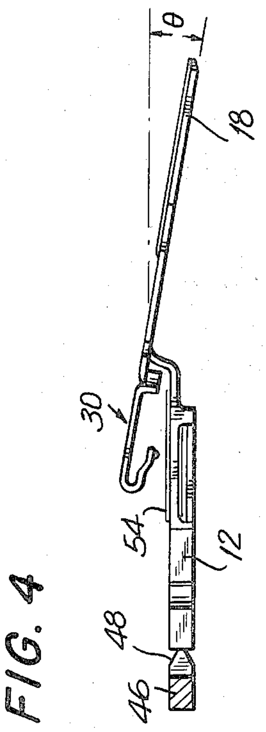
FIG. 4 is a side view of a lead frame in accordance with this invention showing how the lead frame is acted upon during receipt of the die.
Figure 5:
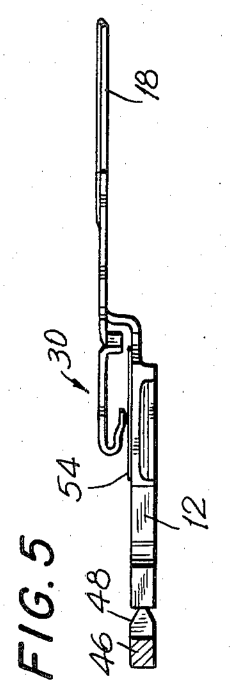
FIG. 5 is a side view of the lead frame after the insertion of the die per FIG. 4 showing the die being held to the substrate or base.

The lead frame assembly 10 of this invention is formed from a single strip of metal having good heat transfer properties and electrical properties, as are well known to those skilled in the art. The strip of metal will be of two thicknesses such that the base or substrate 12 will be of greater mass than connecting leads 14, 16 and 18. In stamping out the frame of FIG. 1 the reduced thickness area is left intact for a short distance behind the base, as at 20, thence cut at an angle to leave a center strip 22 connected therewith. In the same stamping operation connecting leads 14, 16 and 18 are stamped out with transition strips 24 and 26 radiating outwardly adjacent the angled surface and parallelly spaced therefrom. At the same time skinny leads 28 and 30 are formed from the metal to each side of the leads 14 and 18 to have a square cross section of about 10 – 15 mils, the thickness of the sheet behind the base portion. The extreme end of the leads 28 and 30 is punched to provide a large area contact portion 32. Thereafter the metal strip is subjected to a forming step whereby strip 22 is bent upwardly to be normal to the base 12 and portion 20, transition strips 24 and 26 are bent, the terminal portions or skinny leads 28 and 30 being bent over and upwardly first, such that skinny leads 28 and 30 extend forwardly, as at 34; inwardly, as at 36; forwardly, as at 38; downwardly, as at 40; backwardly, as at 42; and angularly, as at 44. During the stamping, portions are punched out to form the several independent lead frames shown by FIG. 1 connected by strip 46 having a reduced connecting element 48 to permit breakaway, as desired, of one or all of the lead frames. As may also be seen by FIG. 1, strips 50 and 52 are left between leads 14 and 16 and 16 and 18, respectively, such that the leads are held together in a fixed relationship.

The leads frames 10 are then provided, by plating, clading or dipping, with a solder to precoat, at least, a selected area of the base and the large areas 32 of leads 28 and 30. They are thereafter ready for assembly of a semiconductor die 54, such as a transistor having a collector terminal on one side and base and emitter terminals on the other in the center and at one corner thereof. The open area between the leads 28 and 30 makes for ease of this assembly enabling a stop (not shown) having normal surfaces to be located adjacent the base such that the transistor may be, after moving the leads downwardly through an angle $\theta$, projected inwardly to abut the stop on two surfaces, such that it is oriented on the base with its sides at an angle to the sides of the base 12.

Thereafter, the downward force on the leads 14, 16 and 18 is released whereby terminal portions 32 biases the transistor or similar semiconductor 54 in place on the base 12. The assembled lead frame with semiconductor is subjected to heat to bond the, for example, collector, base and emitter terminals to the substrate 12 and contact portions 32 of leads 28 and 30.

Next an epoxy or similar plastic housing 56 is formed over a portion of base 12 within which are leads 28 and 30, semiconductor 54 and ends of leads 14, 16 and 18 ahead of strips 50 and 52. After the epoxy has cured the strips 50 and 52 are removed whereupon the leads 14, 16 and 18 are insulated from each other.

The above described arrangement of filament size leads 28 and 30 extending in a longitudinal lateral and vertical permits three dimensional expansion of housing 56 relative to base 12 inherent by heat of operation of the semiconductor means 54 without movement of contact points 32 relative to the base and emitter contacts for means 54. This has enabled improvement in life cycles of the early wire contacts of 1,500 cycles, and the large contacts of lead frames such as disclosed by U.S. Pat. No. 3,597,666 of 2,400 cycles to 6,000 cycles for devices constructed according to this invention. Furthermore, the use of a vertical strip 20 rather than an "S" configuration, has enabled firmer orientation of the connecting leads with respect to the internal leads.

What is claimed is as follows:

1. A means to increase life of a connection between connecting leads of a lead frame and a semiconductor device on a base of a lead frame formed of a sheet of predetermined thickness, said means comprising:

a plurality of skinny leads (relative to connecting leads of the lead frame) having a square cross section of a dimension of the thickness of the sheet, said leads radiating from the connecting leads along sides thereof aside and above a point of connection with the semiconductor device, then inward a predetermined distance to over-lie the respective point of connection of each skinny lead with the semiconductor device, then turning forwardly, downwardly and backwardly towards the respective point of connection, thence angularly downwardly to the respective point of connection; and a plastic housing over said skinny leads, a portion of the connecting leads and a portion of the base to seal the (connection) area of said lead frame having the semiconductor device on the base and the skinny leads and their respective point of connection with the semiconductor device.

2. The structure of claim 1 wherein said skinny leads are joined to transition strips of certain of the connecting leads.

3. The structure of claim 1 wherein the semiconductor device includes a base connection, an emitter connection and a collector connection having two of such joined by said skinny leads to two connecting leads and the other directly connected by a vertical strip from base to another connecting lead.

* * * * *